(12) United States Patent
Lin et al.

(10) Patent No.: US 11,961,745 B2
(45) Date of Patent: Apr. 16, 2024

(54) WET BENCH STRUCTURE

(71) Applicant: TAIWAN SEMICONDUCTOR MANUFACTURING CO., LTD., Hsinchu (TW)

(72) Inventors: Chung-Yu Lin, Hinschu (TW); Shih-Chi Kuo, Yangmei (TW); Chun-Chieh Mo, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/866,908

(22) Filed: Jul. 18, 2022

(65) Prior Publication Data

US 2022/0351986 A1 Nov. 3, 2022

Related U.S. Application Data

(62) Division of application No. 16/413,275, filed on May 15, 2019.

(60) Provisional application No. 62/692,237, filed on Jun. 29, 2018.

(51) Int. Cl.
*H01L 21/02* (2006.01)
*H01L 21/67* (2006.01)
*H01L 21/673* (2006.01)
*H01L 21/687* (2006.01)

(52) U.S. Cl.
CPC .. *H01L 21/67057* (2013.01); *H01L 21/02052* (2013.01); *H01L 21/67086* (2013.01); *H01L 21/6733* (2013.01); *H01L 21/68742* (2013.01); *H01L 21/68764* (2013.01)

(58) Field of Classification Search
CPC ......... H01L 21/00–86; H01L 21/67057; H01L 21/67086
See application file for complete search history.

(56) References Cited

U.S. PATENT DOCUMENTS

| | | | |
|---|---|---|---|
| 5,090,432 A * | 2/1992 | Bran | H01L 21/67051 134/1 |
| 6,337,030 B1 | 1/2002 | Sakaguchi | |
| 6,686,297 B1 | 2/2004 | Gogg et al. | |
| 7,494,597 B2 | 2/2009 | Miyazaki et al. | |
| 2001/0003299 A1 | 6/2001 | Furukawa | |
| 2004/0118693 A1 | 6/2004 | Amador et al. | |
| 2004/0247424 A1* | 12/2004 | Blattner | H01L 21/681 414/754 |
| 2006/0096048 A1 | 5/2006 | Mikhaylichenko et al. | |

(Continued)

FOREIGN PATENT DOCUMENTS

| CN | 1192579 A | 9/1998 |
|---|---|---|
| CN | 2632848 Y | 8/2004 |

(Continued)

*Primary Examiner* — Mikhail Kornakov
*Assistant Examiner* — Richard Z. Zhang
(74) *Attorney, Agent, or Firm* — Sterne, Kessler, Goldstein & Fox P.L.L.C.

(57) ABSTRACT

The present disclosure describes an apparatus for processing one or more objects. The apparatus includes a carrier configured to hold the one or more objects, a tank filled with a processing agent and configured to receive the carrier, and a spinning portion configured to contact the one or more objects and to spin the one or more objects to disturb a flow field of the processing agent.

20 Claims, 8 Drawing Sheets

(56) References Cited

U.S. PATENT DOCUMENTS

| | | | |
|---|---|---|---|
| 2006/0137713 A1* | 6/2006 | Kim | H01L 21/67028 |
| | | | 134/33 |
| 2007/0017901 A1 | 1/2007 | Miyazaki et al. | |
| 2007/0181160 A1* | 8/2007 | Yi | H01L 21/67326 |
| | | | 134/25.1 |
| 2009/0247055 A1* | 10/2009 | Erk | H01L 21/67313 |
| | | | 451/44 |
| 2010/0186180 A1 | 7/2010 | Miller | |
| 2011/0114121 A1* | 5/2011 | Miller | H01L 21/67057 |
| | | | 134/1 |
| 2011/0309051 A1* | 12/2011 | Choi | H01L 21/6708 |
| | | | 156/345.23 |
| 2015/0027491 A1 | 1/2015 | Sakata et al. | |
| 2018/0082834 A1 | 3/2018 | Chen | |
| 2020/0006093 A1 | 1/2020 | Lin et al. | |

FOREIGN PATENT DOCUMENTS

| | | | |
|---|---|---|---|
| CN | 1830070 A | | 9/2006 |
| CN | 103839773 A | * | 6/2014 |
| CN | 103839773 A | | 6/2014 |
| CN | 107706144 A | | 2/2018 |
| CN | 107968060 A | | 4/2018 |
| CN | 108206145 A | * | 6/2018 |
| JP | H04340226 A | | 11/1992 |
| JP | 2000-183026 A | | 6/2000 |
| JP | 2002-231690 A | | 8/2002 |
| JP | 2006324386 A | | 11/2006 |
| KR | 20020017395 A | * | 3/2002 |
| WO | WO-02054471 A1 | | 7/2002 |

* cited by examiner

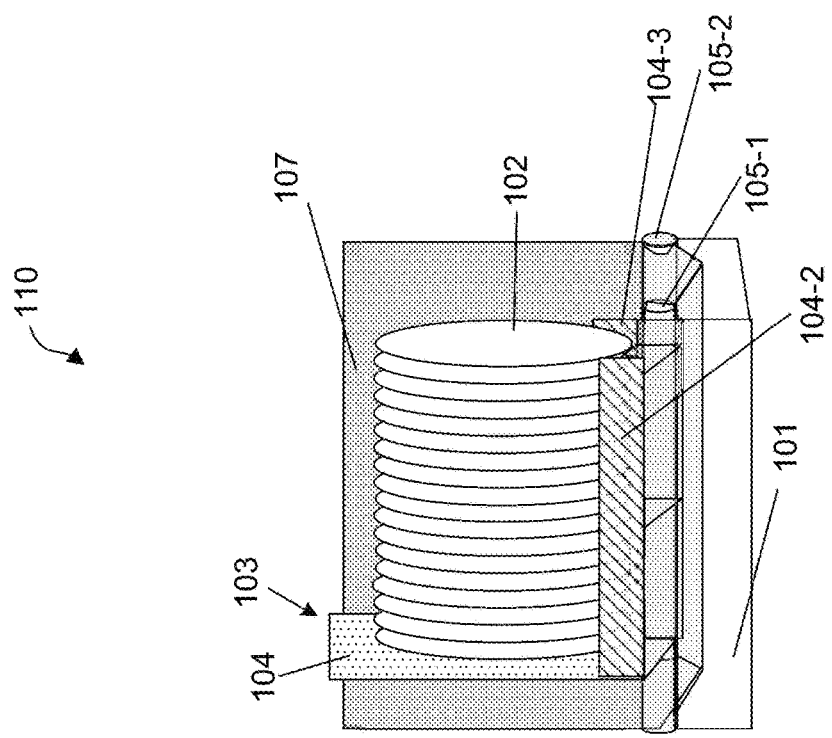
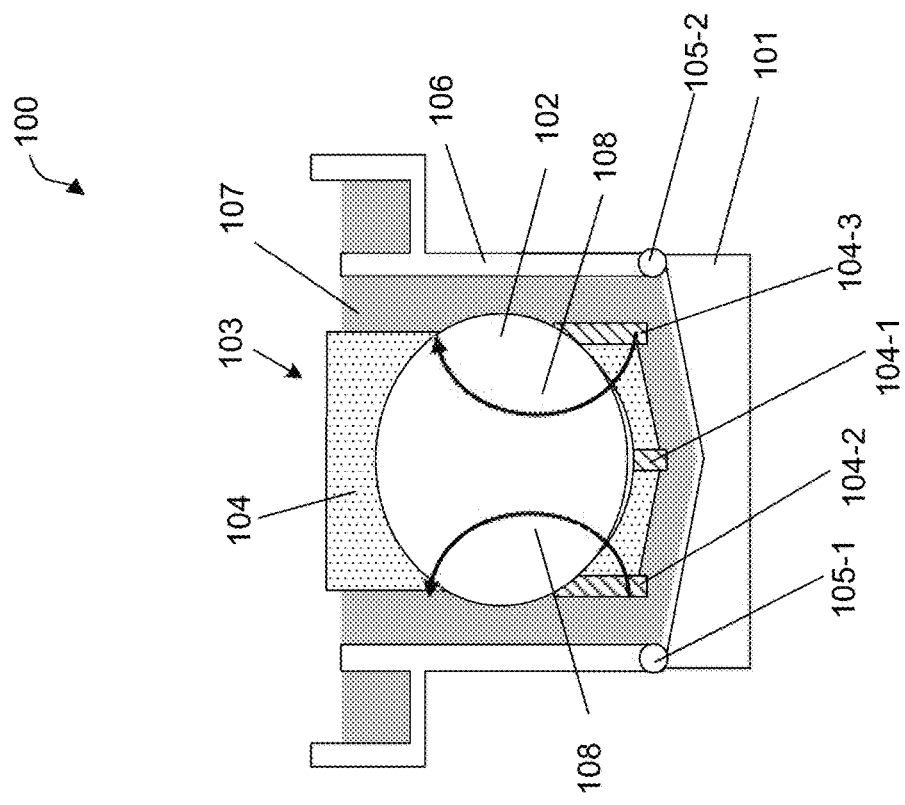
FIG. 1A
FIG. 1B

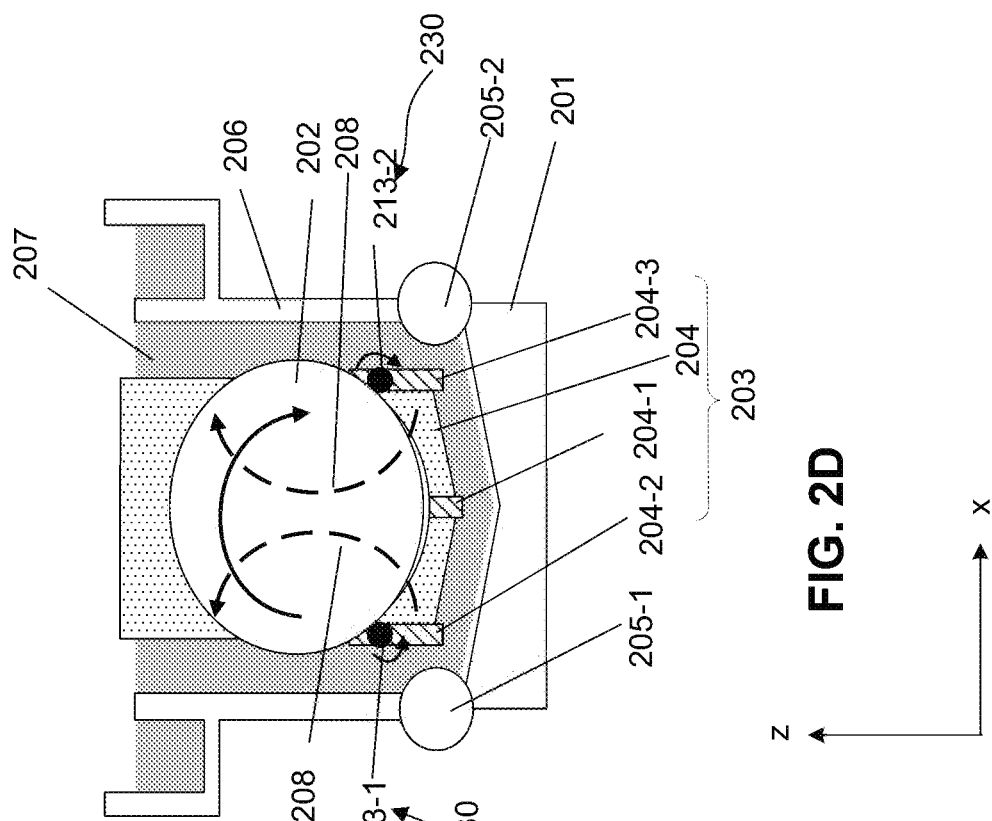
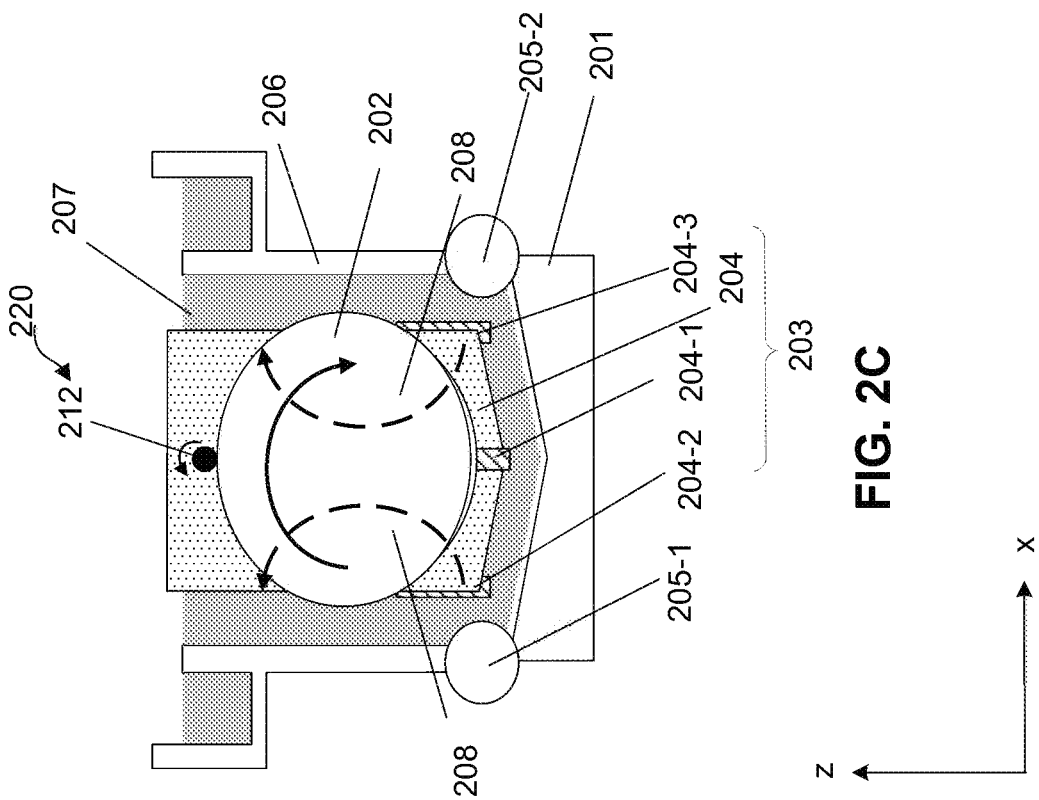
FIG. 2C
FIG. 2D

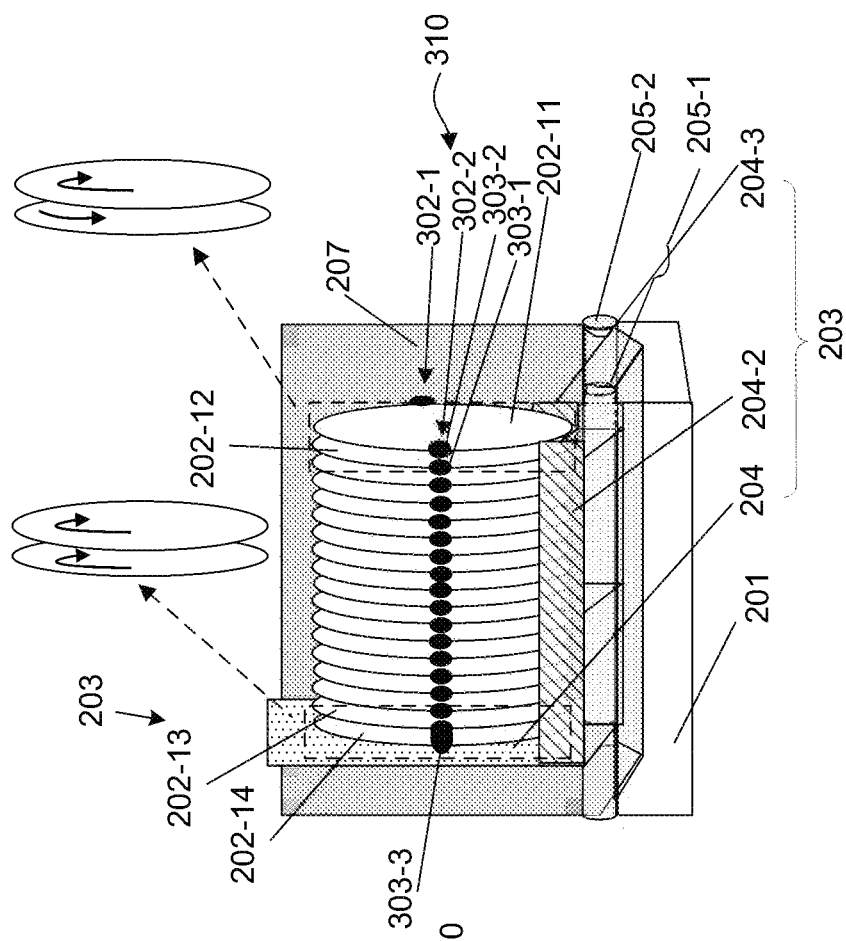
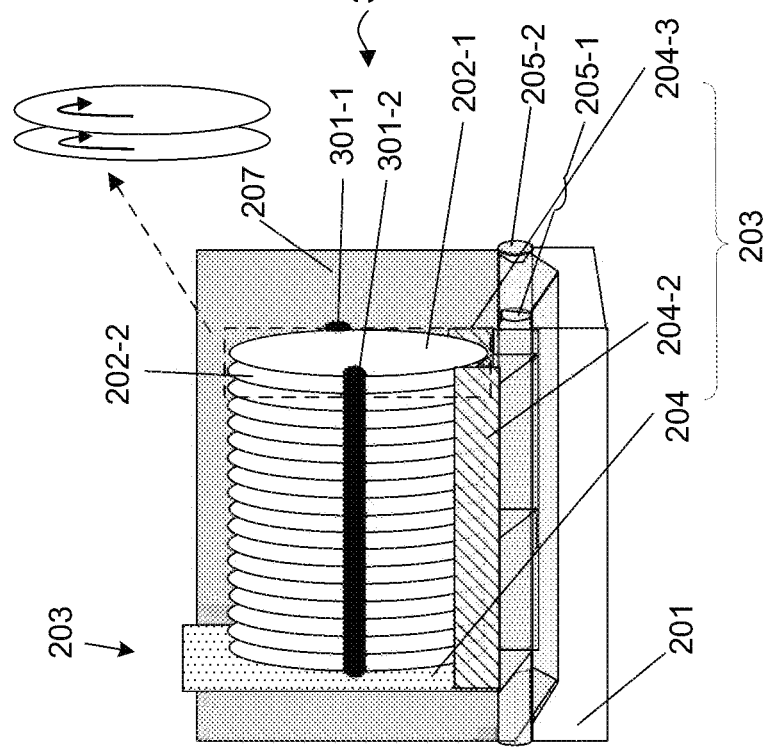
FIG. 3B
FIG. 3A

WET BENCH STRUCTURE

CROSS-REFERENCE TO RELATED APPLICATION

The present application is a divisional of U.S. Nonprovisional patent application Ser. No. 16/413,275, filed on May 15, 2019, titled "Wet Bench Structure," which claims the benefit of U.S. Provisional Patent Application No. 62/692,237, filed on Jun. 29, 2018, titled "Novel Wet Bench Structure." The contents of the aforementioned applications are incorporated by reference herein in their entireties.

BACKGROUND

Wet benches are widely used in semiconductor manufacturing for chemical handling and etching of materials. A wet bench can have a tank (e.g., a wet bench tank) that contains processing agents (e.g., fluid) for various purposes. For example, the wet bench can contain acids for etching materials, a photoresist stripper for stripping off photoresist from a surface, and/or a cleaning solution to clean wafers/devices. Wafers can be placed in wet benches and immersed in the processing agent. A wafer carrier (e.g., a structure that carriers the wafers) can be part of the tank or can be placed in the tank to immerse a batch of wafers to be processed (e.g., cleaned or etched) in the processing agent. The processing agent circulates in the tank and can be used to process multiple batches of wafers.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

FIG. 1A illustrates a cross-sectional view of a wet bench tank, according to some embodiments of the present disclosure.

FIG. 1B illustrates a side view of the wet bench tank of FIG. 1A.

FIGS. 2A-2E each illustrates a cross-sectional view of a wet bench structure, according to some embodiments of the present disclosure.

FIGS. 3A and 3B each illustrates a side view of another wet bench structure, according to some embodiments of the present disclosure.

DETAILED DESCRIPTION

Figure 2B:
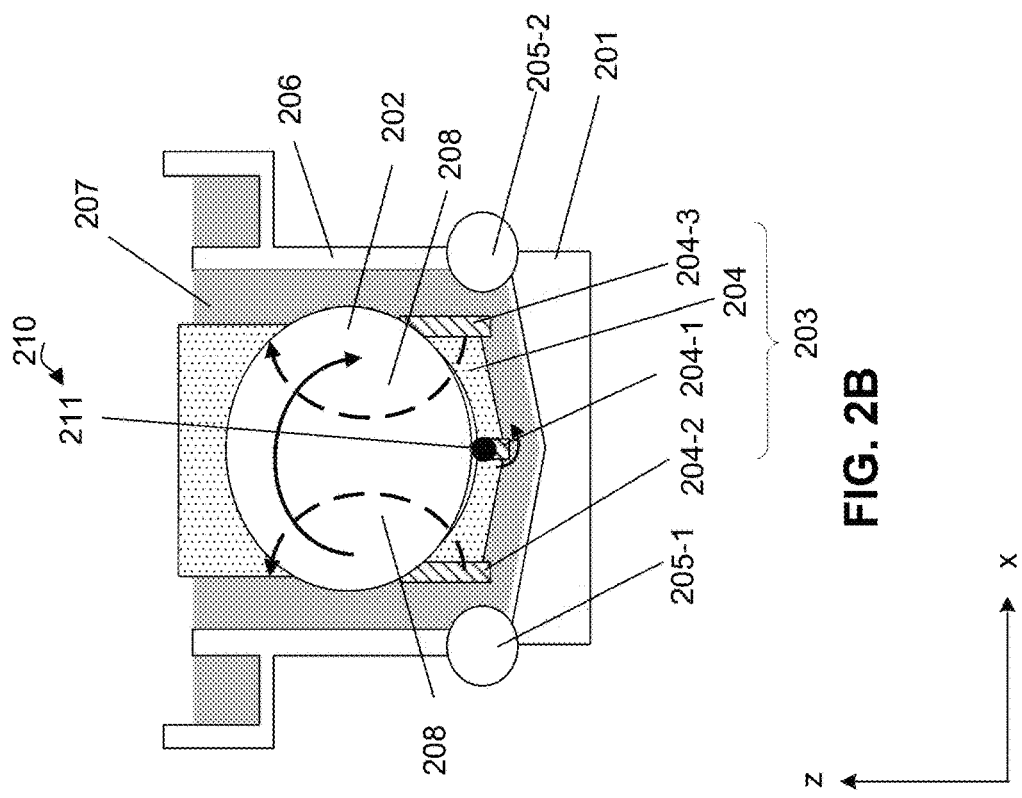

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

In semiconductor fabrication, wet benches can contain various processing agents for different operations. To perform these operations, a wet bench tank can be filled with a desired processing agent. Wafers to be processed can be immersed in the processing agent for a suitable period of time for chemical/physical reactions to take place. These wafers can undergo processing/operations such as etching, cleaning, or stripping in the processing agent. For example, wafers can be immersed in the wet bench tank filled with an etchant solution to remove/etch away desired portions or structures on the wafer. The wet bench tank can also be filled with a photoresist stripper or a cleaning agent for stripping off photoresist or cleaning wafers, respectively.

The processing agent contained in the wet bench tank can be used to process multiple batches of wafers. For example, the processing agent can circulate in the wet bench tank for a predetermined period of time until it's replaced with unused processing agent. The circulation of the processing agent forms a flow field (e.g., the distribution of the density and velocity of the processing agent over space and time), which can be unchanged during the processing under unchanged circulation directions. The flow field can form flow-field paths in the tank that allow processing agent to stream along. The streams can bring processing residue (e.g., residue formed as a result of processing) to move along the flow-field paths. The processing residue can include undesired particles formed during the processing of wafers (e.g., current batch or previous batches of wafers). For example, if the processing agent includes an etchant, the processing residue can include undesired semiconductor particles; and if the processing agent includes photoresist stripper, the processing residue can include undesired photoresist particles/pieces, etc.

Because the flow-field paths form close to and/or against the wafers and the carrier that holds the wafers, the processing residue brought by the stream can deposit on the wafers, causing damage and/or contamination to the structures/devices on the wafers. The processing residue can also deposit on the carrier. The deposited residue can further peel off under the forces of stream/current and can be moved towards the wafers, causing further damage to (e.g., scratches and peeling) and/or contamination on the wafers. The damage and/or contamination can cause device degradation and/or a decrease product yield. Further, because the wafers are placed close to one another, the stream/current can impact the wafers and cause adjacent wafers to collide with one another, thus damaging the devices/structures on the colliding wafers. Thus, wafers in a wet etch tank can suffer from low yield, damage, and/or degradation as a result of unchanged flow field and residue deposit.

FIG. 1A illustrates a cross-sectional view 100 of a wet bench tank (or tank) along the x-z plane. The y axis is perpendicular to the x-z plane. FIG. 1B illustrates a side view 110 of the tank illustrated along a non-zero angle (e.g., about 45 degrees) to the x axis (or y axis). As shown in FIGS. 1A and 1B, tank 106 is located on a base 101. Tank 106 is filled with a processing agent 107 which can be, e.g., an etchant, a photoresist stripper, or an cleaning agent/solution. A batch of wafers 102 is carried by carrier 103 and is immersed in processing agent 107. Wafer 102 includes structures that are to be processed. Carrier 103 includes a handle 104 and lifting devices (104-1, 104-2, and 104-3)

connected one another. Handle 104 extends out of processing agent 107 so carrier 103 can be moved in and out of tank 106. Lifting devices 104-1, 104-2, and 104-3 each extends along the y axis and holds the batch of wafers 102 to be upright (e.g., along the z axis) and separated from one another so that surfaces of wafers 102 are immersed in processing agent 107. Inlets 105-1 and 105-2 each allows processing agent 107 to circulate into tank 106 at a desired speed and direction.

Arrows in FIG. 1A illustrates flow-field paths 108 of processing agent 107, which are formed by the circulation of processing agent 107. During processing, processing residue/particles (e.g., etched particles/residue or photoresist pieces) can be formed and can suspend in processing agent 107. These processing residue/particles can be flushed towards wafers 102 and the lifting devices (e.g., 104-1, 104-2, and 104-3) by the stream along flow-field paths 108, colliding with wafers 102 and the lifting devices. Because the stream/current keeps flowing along flow-field paths 108, wafers 102 and lifting devices can thus be susceptible to residue/particle residue due to the unchanged flow-field paths 108—especially certain areas on wafers 102 and the lifting devices (e.g., areas close to flow-field paths 108) can be deposited with a layer of processing residue. As processing agent 107 circulates along flow-filed paths 108, the deposited layer of residue/particles can thicken. With the effect of the stream, the deposited processing residue can peel off, and the broken pieces of deposit can be flushed towards wafer 102 along flow-field paths 108, colliding with wafers 102. The collision can cause damage (e.g., scratches and peeling) and/or contamination on wafers 102. The devices/structures on wafers 102 can suffer from low yield and degradation caused by the damage and/or contamination.

The present disclosure provides an apparatus and a method for reducing or preventing processing residue from damaging/contaminating wafers in a wet bench tank. The apparatus uses a mechanism (e.g., rollers) to disturb the flow field of the processing agent. Under a disturbed flow field, the stream and the suspended residue are dispersed. Residue is thus less likely to collide with or deposit at certain areas of the wafers and the lifting devices (e.g., areas that are close to the flow-field paths), thus reducing damage (e.g., scratches and surface peeling) and contamination. Also, because residue is less likely to collide with the wafers, adjacent wafers are less susceptible to collide with one another.

An additional benefit of the disclosed apparatus is its compact size, in which the apparatus consumes minimal or no additional space in the tank of a wet bench. The tank can thus contain substantially the same volume of processing agent. Also, the apparatus spins wafers to disperse the flow-field paths, maximizing the force to disperse the flow field with minimum additional space. In the present disclosure, the term "processing residue" and "residue" can be used interchangeably; and the term "processing deposit," "residue deposit," and "deposit" can be used interchangeably.

The apparatus can be used in different tanks/wet benches to improve processing efficiency and product yield. For illustrative purposes, rollers that spin the wafers are described in the present disclosure as examples of the apparatus. The apparatus can disturb the flow field in the tank and can thus reduce damage and contamination caused by the unchanged flow field and residue deposit. The apparatus can also be in the form of other various structures/devices that can disturb the flow field in the tank. The disclosed working principle can be implemented in the form of different devices/structures, such as fan/propeller shaped structures that create a disturbed flow field in a wet bench tank. The specific forms and variations of the devices/structures should not be limited by the embodiments of the present disclosure. By using the disclosed apparatus and method, the processing efficiency can be improved and damage and/or contamination on the wafers can be reduced.

FIGS. 2A-2E illustrate different arrangements of a wet bench structure (e.g., rollers) fixed/mounted in a wet bench tank. The rollers spin/move so that the flow field of the processing agent in the wet bench tank can be disturbed. Accordingly, processing residue is less likely to collide and/or deposit on the wafers and/or lifting devices in the wet bench tank. Also, the stream and residue flowing towards the wafers are dispersed to minimize an impact of the process residue on the wafers, thus reducing the likelihood that adjacent wafers will collide with one another.

The rollers shown in FIGS. 2A-2E can be applied to one or more wafers along a direction in which the one or more wafers are arranged (e.g., along a direction perpendicular to the x-z plane or along a y axis similar to the y axis of FIG. 1B). The one or more wafers can spin accordingly against/in/near the flow field of the processing agent to disturb the flow field. For example, the rollers can have a rod shape that extends along the y axis and can contact and spin all the wafers along the y axis. In another example, the rollers can include a multiple sub-rollers extending along the y axis. The sub-rollers may or may not be connected to one another. Each sub-roller can contact and spin one or more wafers. The sub-rollers can spin along the same direction or along different directions. The cross-section (e.g., along the x-z plane) of the roller or the sub-roller can have any suitable shape such as a circular shape along the x-z plane.

When a roller or a sub-roller contacts a wafer, the friction between the roller/sub-roller and the wafer can be sufficiently high to spin the wafer. The roller/sub-roller can be formed by a suitable material that is chemically stable in the processing agent. The material can have sufficiently high resistance to erosion and corrosion of the processing agent. In various applications, the material that forms the roller/sub-roller can be changed based on the processing agent so the roller/sub-roller can be chemically stable in the processing agent. For example, if the processing agent includes acid, the roller/sub-roller can include an acid-resistant material. In some embodiments, the roller/sub-roller includes Teflon.

The roller/sub-roller can be driven by any suitable drive system that drives the roller/sub-roller to spin along a desired direction (e.g., clockwise or counter-clockwise). The spin (e.g., speed, duration, and direction) of the roller/sub-roller can also be controlled by a control unit/device (e.g., computer) so that the spinning of roller/sub-roller can be controlled and adjusted automatically or manually. For example, the control unit/device can be installed with programs and data to control/determine the speed, duration, and/or spin direction of the roller/sub-roller. The speed, duration, and/or spin direction can be changed automatically or manually based on various conditions of the processing, e.g., the batch and/or load of the wafers. In an example, sub-rollers are separately controlled (e.g., through wired or wireless communication means) so the control unit/device can control the speed, duration, and/or spin direction of different sub-rollers. The flow field at different parts of the tank can be disturbed separately if necessary. For example, the roller/sub-roller can communicate with the control unit/device through a local area network (LAN) and/or a WiFi network to receive commands (e.g., to start/stop spinning of the roller/sub-roller). For simplicity, the communication between the roller/sub-roller and the control unit/device and between the roller/sub-roller and the drive system are not shown in the figures of the present disclosure.

Figure 2A:
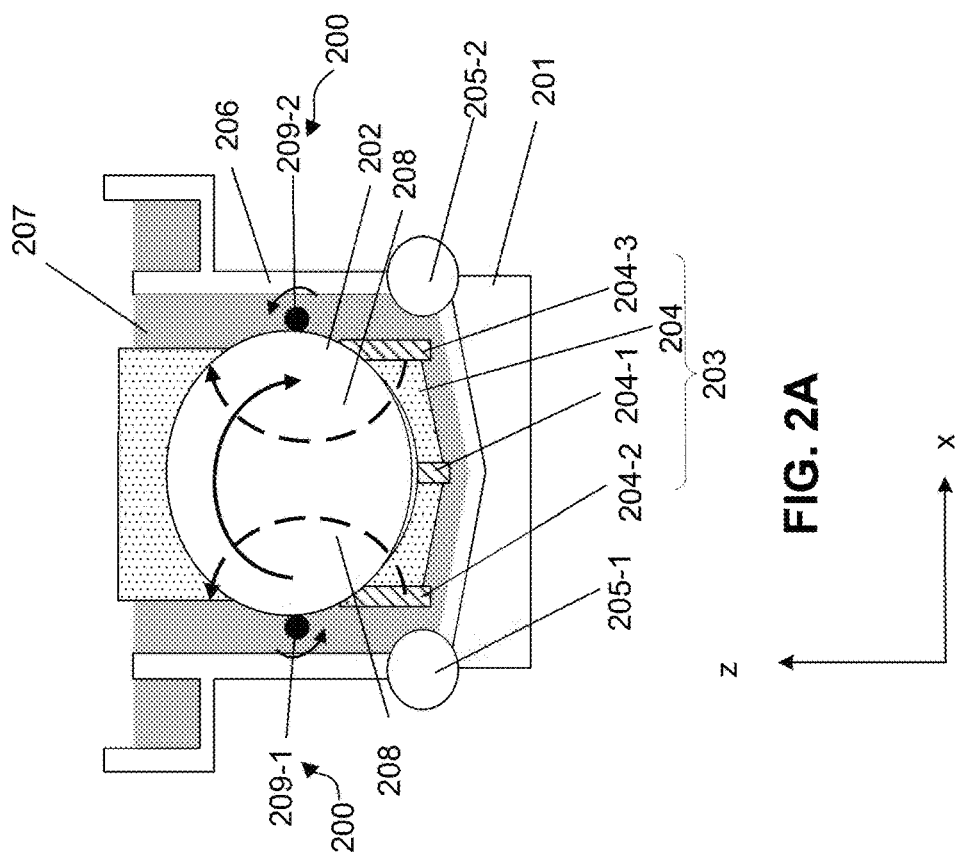

FIG. 2A illustrates a cross-sectional view of a wet bench structure 200, according to some embodiments. Wet bench structure 200 can include rollers 209-1 and 209-2 fixed/mounted on two sides of wafers 202 and in contact with wafers 202 substantially at the middle portion of wafers. In some embodiments, rollers 209-1 and 209-2 can align horizontally (e.g., along the x axis). In some embodiments, rollers 209-1 and 209-2 and the geometric center of wafers 202 substantially align horizontally. Rollers 209-1 and 209-2 can support the wafers horizontally (e.g., along the x axis) and thus improve the spin stability of wafers 202.

Wet bench structure 200 can be placed in a tank 206. Tank 206 can be filled with a processing agent 207, which can include any suitable chemical (e.g., etchant, photoresist stripper, or cleaning agent) for processing wafers 202. A carrier 203 can include a handle 204 and multiple lifting devices (e.g., 204-1, 204-2, and 204-3) connected to handle 204. Handle 204 can extend out of processing agent 207 for ease of placing/handling carrier 203. The lifting devices can extend along the y axis and can be used to support wafers 202 in processing agent 207. In some embodiments, the lifting devices have a rod shape extending along the y axis and have grooves along the y axis for holding wafers 202 in place. Wafers 202 can be separated from one another and can be held upright along the z axis. In some embodiments, lifting device 204-1 supports wafers 202 on the bottom portion of wafers 202, and lifting devices 204-2 and 204-3 support wafers 202 on either side of lifting device 204-1 at the lower portion of wafers 202. In some embodiments, lifting device 204-1 is substantially at the middle point between lifting devices 204-2 and 204-3 along the x axis. Wafers 202 can be placed upright and separated from one another. Tank 206 can include one or more inlets (e.g., 205-1 and 205-2) for circulation of processing agent 207. In some embodiments, the inlets face towards wafers 202, and processing agent 207 can flow into tank 206 through the inlets. Dashed arrows represent flow-field paths 208 of processing agent 207. Stream of processing agent 207 circulating from inlets 205-1 and 205-2 can flow along flow-field paths 208. In some embodiments, flow-field paths 208 include a clockwise path and a counter-clockwise path, as shown in FIG. 2A.

Rollers 209-1 and 209-2 can be fixed or mounted in any suitable way. For example, roller 209-1 and 209-2 can be fixed or mounted on the sidewalls of tank 206 and/or to the bottom of tank 206. For example, rollers 209-1 and 209-2 can be fixed or mounted through a suitable support structure (not shown) such as a frame that hangs over wafers 208 and/or extends along the sidewalls of tank 206. If rollers 209-1 and 209-2 include sub-rollers, the sub-rollers can be fixed/mounted together or separately. For example, more than one sub-roller can be fixed/mounted on a same support structure, or each sub-roller can be fixed/mounted on a different support structure.

Rollers 209-1 and 209-2 can be driven to spin clockwise or counter-clockwise, thus spinning wafers 202 counter-clockwise or clockwise. The speed of the wafer spin can be directly proportional to the speed of rollers 209-1 and 209-2. In some embodiments, rollers 209-1 and 209-2 spin counter-clockwise and spin wafers 202 clockwise, as shown in FIG. 2A. In some embodiments, rollers 209-1 and 209-2 each has a rod shape extending along the y axis and spins each one of wafers 202 clockwise or counter-clockwise at a same speed. In some embodiments, rollers 209-1 and 209-2 each incudes multiple sub-rollers extending along the y axis and spins each one of wafers 202 clockwise or counter-clockwise. The sub-rollers can be driven to spin at a same speed or at different speeds. For example, based on the locations of wafers 202, the first and last wafers can be spun at a higher speed than the wafers between the first and last wafers. In some embodiments, rollers 209-1 and 209-2 can spin wafers 202 at any speed greater than 0 revolutions per minute (rpm). In some embodiments, rollers 209-1 and 209-2 can spin at a speed based on an afflux speed of processing agent 207 from inlets 205-1 and 205-2. For example, rollers 209-1 and 209-2 can spin wafers 202 at a lower speed when the afflux speed is relatively low, etc. In some embodiments, processing agent 207 circulates through more than two inlets (205-1 and 205-2), and the sub-rollers can be controlled to spin at different speeds based on the flow field formed by the more than two inlets.

Each one of rollers 209-1 and 209-2 can contact one or more of wafers 202 and spin the contacted wafers. For example, each of rollers 209-1 and 209-2 can be a one-piece structure extending along the y axis. In some embodiments, rollers 209-1 and 209-2 contact/support and spin at least one of wafers 202. In some embodiments, rollers 209-1 and 209-2 each supports/contacts and spins each one of wafers 202. In another example, rollers 209-1 and 209-2 can each include multiple sub-rollers. Each sub-roller supports/contacts and spins one or more of wafers 202. In some embodiments, each sub-roller supports/contacts and spins a different one of wafers 202. The sub-rollers of rollers 209-1 and 209-2 can be controlled to spin at a same speed and/or a same direction or at different speeds and/or different directions. Rollers 209-1 and 209-2 can be made of a suitable material that is chemically stable in processing agent 207 and has sufficient friction to spin wafers 202. In some embodiments, rollers 209-1 and 209-2 can include Teflon.

FIG. 3A illustrates a side view of wet bench structure 300, and FIG. 3B illustrates a side view of another wet bench structure 310, according to some embodiments. As shown in FIG. 3A, wet bench structure 300 includes rollers 301-1 and 301-2, in which each roller has a rod shape along the y axis. In some embodiments, rollers 301-1 and 301-2 each includes a one-piece structure that contacts and spins each of wafers 202. The wafers 202 can be spun along the same direction at a same speed. For example, wafers 202-1 and 202-2 in a dashed box of FIG. 3A can spin clockwise at a same speed.

As shown in FIG. 3B, wet bench structure 310 includes rollers 302-1 and 302-2, in which each roller has a rod shape along the y axis. In some embodiments, rollers 302-1 and 302-2 each includes multiple sub-rollers (e.g., sub-rollers 303-1, 303-2, and 303-3). Each of the sub-rollers can support/contact and spin one or more of wafers 202. In some embodiments, wafers 202 are spun to have non-uniform spinning directions and speed. For example, wafers 202-11 and 202-12 can each be spun by a different sub-roller (e.g., sub-rollers 303-1 and 303-2) and can spin along a different direction (e.g., clockwise and counter-clockwise). Wafers 202-11 and 202-12 can spin at the same speed or different speeds (e.g., along opposite directions). In another example, wafers 202-13 and 202-14 can be spun by one sub-roller (e.g., 303-3) and can spin along the same direction (e.g., clockwise). The arrangement of sub-rollers should be determined by, e.g., the flow field in tank 206, the sizes of wafers, and the structures/devices on the wafers, and should not be limited by the embodiments of the present disclosure.

The spinning of wafers 202 can disturb flow field in tank 206 so flow-field paths 208 can change, e.g., to a more dispersive pattern. Instead of impacting and depositing on certain areas of wafers 202 and the lifting devices (e.g., the areas close to flow-field paths 208 and more susceptible to deposit), the residue can be dispersed. The dispersed residue can be less likely to impact and deposit on these certain areas of wafers 202 and the lifting devices. Thus, less residue and/or peeled deposit can move towards wafers 202 and the lifting devices, thus reducing damage and/or contamination caused by the residue and/or peeled deposits.

FIGS. 2B and 2C illustrate a cross-sectional view of wet bench structures 210 and 220, according to some embodiments. A single roller can be positioned under wafers 202 (e.g., roller 211 in FIG. 2B) or over wafers 202 (e.g., roller 212 in FIG. 2C) to spin wafers 202. Roller 211 and roller 212 can each be placed substantially at the middle line (e.g., the line along the z axis that equally divides wafers 202 into two portions) of wafers 202. Roller 211 and roller 212 can each be fixed or mounted in a suitable way to support/contact and spin wafers 202. For example, roller 211 can be fixed or mounted on lifting device 204-1 and/or the bottom of tank 206. Roller 212 can be fixed on sidewalls of tank 206, one or more lifting devices (e.g., 204-1, 204-2, and 204-3), handle 204, and/or a suitable object (e.g., with sufficient stiffness and support) over tank 206. In some embodiments, roller 212 can be fixed onto a frame, in which the frame can be placed over wafers 202 so roller 212 can properly support/contact and spin wafers 202. Rollers 211 and 212 can each be similar to or the same as rollers 209-1 and 209-2. Details of structure, material, and operation of roller 211 and roller 212 can be referred to the description of wet bench structure 200 of FIG. 2A.

FIG. 2D illustrates a cross-sectional view of a wet bench structure 230, according to some embodiments. Wet bench structure 230 includes rollers 213-1 and 213-2 fixed or mounted on lifting devices 204-2 and 204-3, respectively. Rollers 210-1 and 210-2 can align horizontally (e.g., along the x axis) and can be positioned lower than rollers 209-1 and 209-2 along the z axis. In some embodiments, rollers 213-1 and 213-2 can also be fixed or mounted on the sidewalls of tank 206. Each one of rollers 213-1 and 213-2 can be similar to or the same as rollers 209-1 and 209-2 described in FIG. 2A. Details of the structure, material, and operation of rollers 213-1 and 213-2 can be referred to the description of rollers 209-1 and 209-2.

Figure 2E:
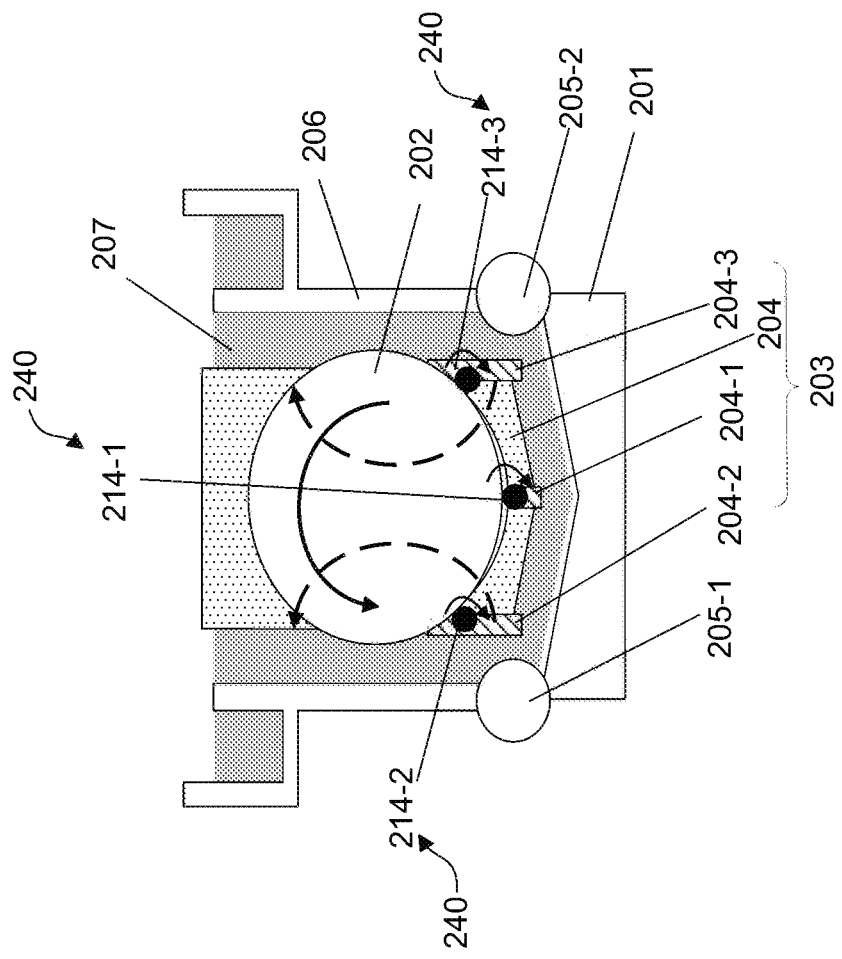

FIG. 2E illustrates a cross-sectional view of a wet bench structure 240, according to some embodiments. Wet bench structure 240 includes rollers 214-1, 214-2, and 214-3, which are fixed or mounted on lifting devices 204-1, 204-2, and 204-3, respectively. Rollers 214-2 and 214-3 can align horizontally (e.g., along the x axis) and can be positioned higher than roller 214-1 along the z axis. In some embodiments, rollers 214-1, 214-2, and 214-3 can be fixed or mounted on the sidewalls and/or bottom of tank 206. Rollers 214-1, 214-2, and 214-3 can spin at the same speed and at the same direction (e.g., clockwise or counter-clockwise). Each one of rollers 214-1, 214-2, and 214-3 can be similar to or the same as rollers 209-1 and 209-2 described in FIG. 2A. Details of the structure, material, and operation of rollers 214-1, 214-2, and 214-3 can be referred to the description of rollers 209-1 and 209-2 of FIG. 2A.

In some embodiments, a wet bench structure can include at least four rollers for spinning wafers. For example, three rollers (e.g., fixed/mounted on the lifting devices) can support/contact and spin the wafers from the lower portion of the wafers and one roller (e.g., fixed/mounted on a frame over the wafers) can support/contact and spin the wafers from the top of the wafers. The specific number of parts (e.g., rollers), the arrangement (e.g., the relative positions of the parts in respect to the wafers and the tank), and the operation of the wet bench structure should be determined based on the processing condition and should not be limited by the embodiments of the present disclosure.

Figure 4:
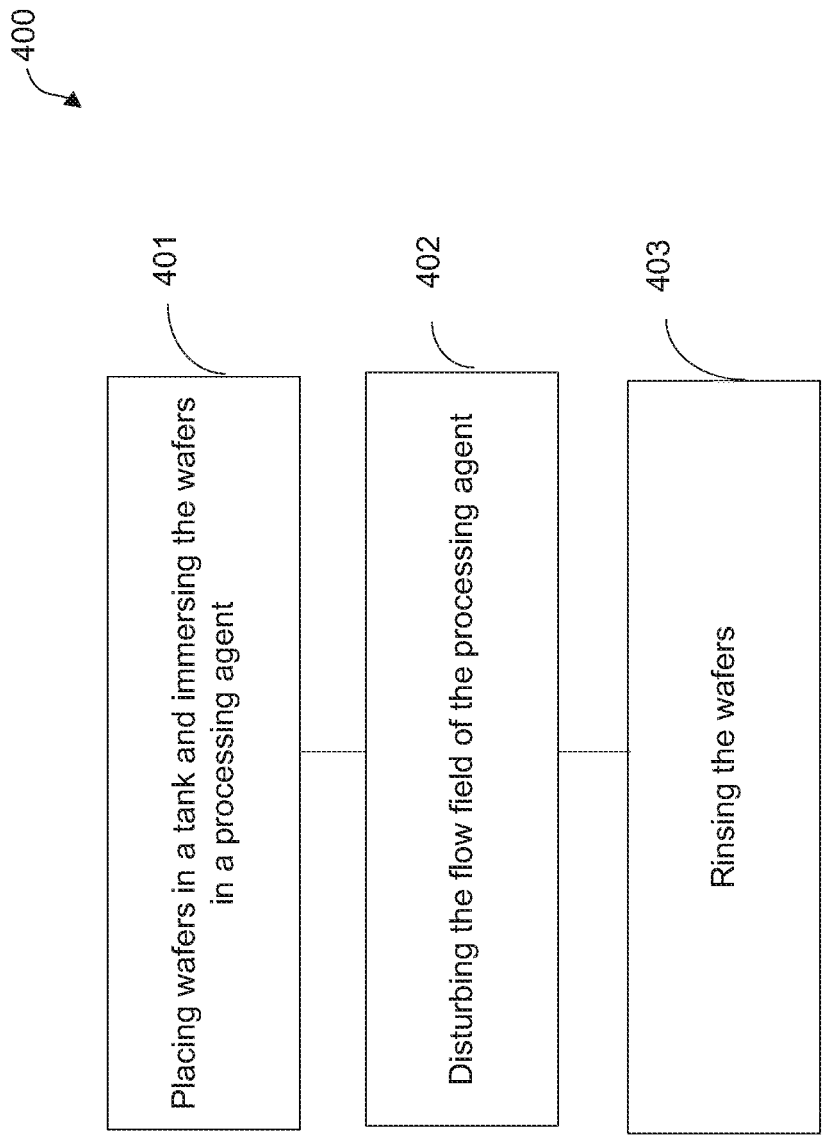
FIG. 4 illustrates a process flow to clean wafers using a wet bench structure, according to some embodiments of the present disclosure.

FIG. 4 illustrates a method 400 for processing one or more wafers with a wet bench structure, according to some embodiments. In some embodiments, operations of method 400 can be performed in a different order. Variations of method 400 are within the scope of the present disclosure.

In operation 401, wafers are placed in a tank of a wet bench and immersed in a processing agent. The wafers can be processed (e.g., etched, stripped, or cleaned) in the processing agent, which circulates in the tank through inlets and outlets. The circulation of the processing agent form a flow field in the tank. The wafers can be placed upright and separated from one another. Rollers can contact and/or support the wafers after the wafers are placed in the tank. The rollers can include sub-rollers that each spins the wafers. Details of the rollers and their relative positions with respect to the wafers can be found in the description of FIGS. 2A-2E and 3A and 3B.

In operation 402, the flow field of the processing agent is disturbed when the wafers are being processed. In some embodiments, rollers spins along a predetermined direction to spin wafers along an opposite direction. Current/streams circulating in directions different from the flow-field paths can be formed by spinning the wafers, thus disturbing the processing agent's flow field. The direction and speed of the rollers can be determined based on various factors, such as the position of the wafers, the size of the wafers, and the flow field of the processing agent. The wafers can be spun at the same speed along the same direction. In some embodiments, the rollers can be spun along opposite directions and at the same speed or different speed. In some embodiments, the speed can be any suitable non-zero value. In some embodiments, a portion of wafers have a speed of zero (e.g., not spinning) The spinning of wafers can disturb the flow field in the tank caused by the circulation of the processing agent. The disturbed flow field can reduce or prevent residue from depositing on or impacting the wafers. Residue is also less likely to deposit on the lifting devices under the disturbed flow field. Details of the operation of rollers can be found in the description of FIGS. 2A-2E and 3A and 3B.

In operation 403, the wafers are rinsed after the processing is completed. The wafers can be rinsed in the tank or outside the tank.

Figure 5:
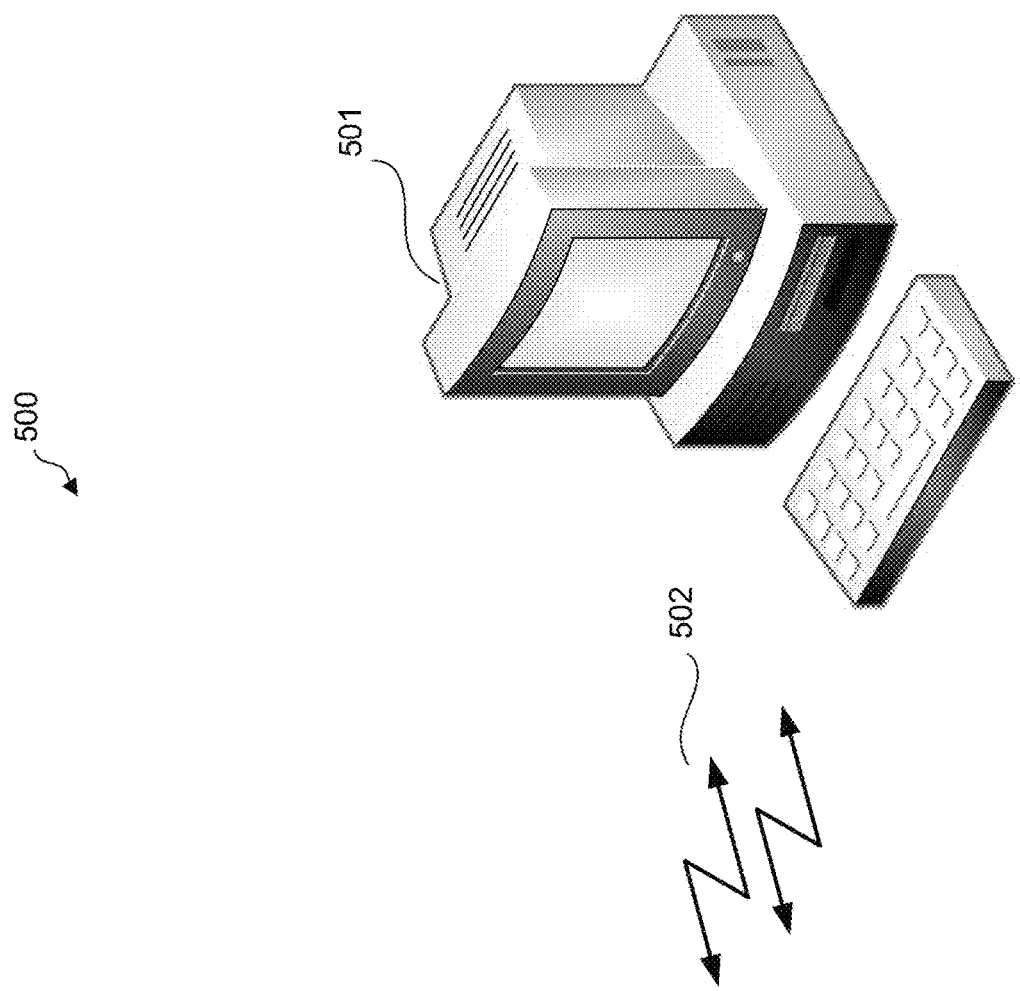
FIG. 5 illustrates a control system, according to some embodiments of the present disclosure.
Figure 5:
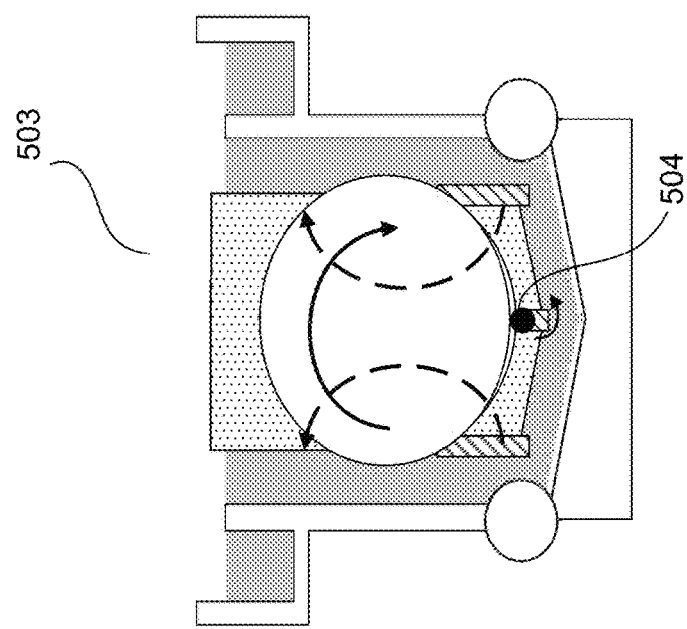

FIG. 5 illustrates a system 500 using a wet bench structure, according to some embodiments. As shown in FIG. 5, system 500 includes a control unit/device 501, a communication means 502, and wet bench 503 with a wet bench structure 504.

Control unit/device 501 can include any suitable computer system (e.g., workstation and portable electronic device) to store programs and data for controlling the movement (e.g., spinning) of wet bench structure 504 (e.g., rollers). For example, the acceleration, deceleration, and change of spin direction of wet bench structure 504 can be transmitted in control signals for automatically or manually adjusting/controlling the movement of wet bench structure 504. Communication means 502 can include any suitable network connection between control unit/device 501 and wet bench structure 504, and the control signals it transmits. For example, communication means 502 can include a local area network (LAN) and/or a WiFi network. In some embodiments, control unit/device 501 transmits control signals through communication means 502 to adjust/control the movement of wet bench structure 504.

Wet bench structure 504 can include a structure/device that disturbs the flow field in wet bench 503. Wet bench structure 504 can have various forms, and each form can have different variations. For example, wet bench structure 504 can be in the form of rollers that spin wafers to disturb the flow field. The rollers can have different arrangements/variations in wet bench 503, depending on the processing conditions and/or applications. Wet bench structure 504 can also have other forms, such as a propeller/fan shape structure that produces rotational motion in the processing agent and disturbs the flow field. One or more propeller/fan shaped wet bench structure 504 can be placed/installed at different positions in wet bench 503. Wet bench structure 504 can also be used to process any other suitable objects, such as objects that have a disk shape and can be spun in liquid/fluid. The specific shapes and arrangement of wet bench structure 504 and the objects cleaned by wet bench structure 504 should not be limited by the embodiments of the present disclosure.

Wet bench structure 504 can further include a power portion (not shown) and a communication portion (not shown). For example, the power portion of wet bench structure 504 can include a power cord that connects to a power source or the power supply of wet bench 503. The communication portion can include cables and/or receiving devices for receiving control signals from control unit/device 501. In some embodiments, the communication portion is connected to the power portion so that the driving power provided to wet bench structure 504 can be adjusted/controlled based on the control signals from control unit/device 501.

Figure 6:
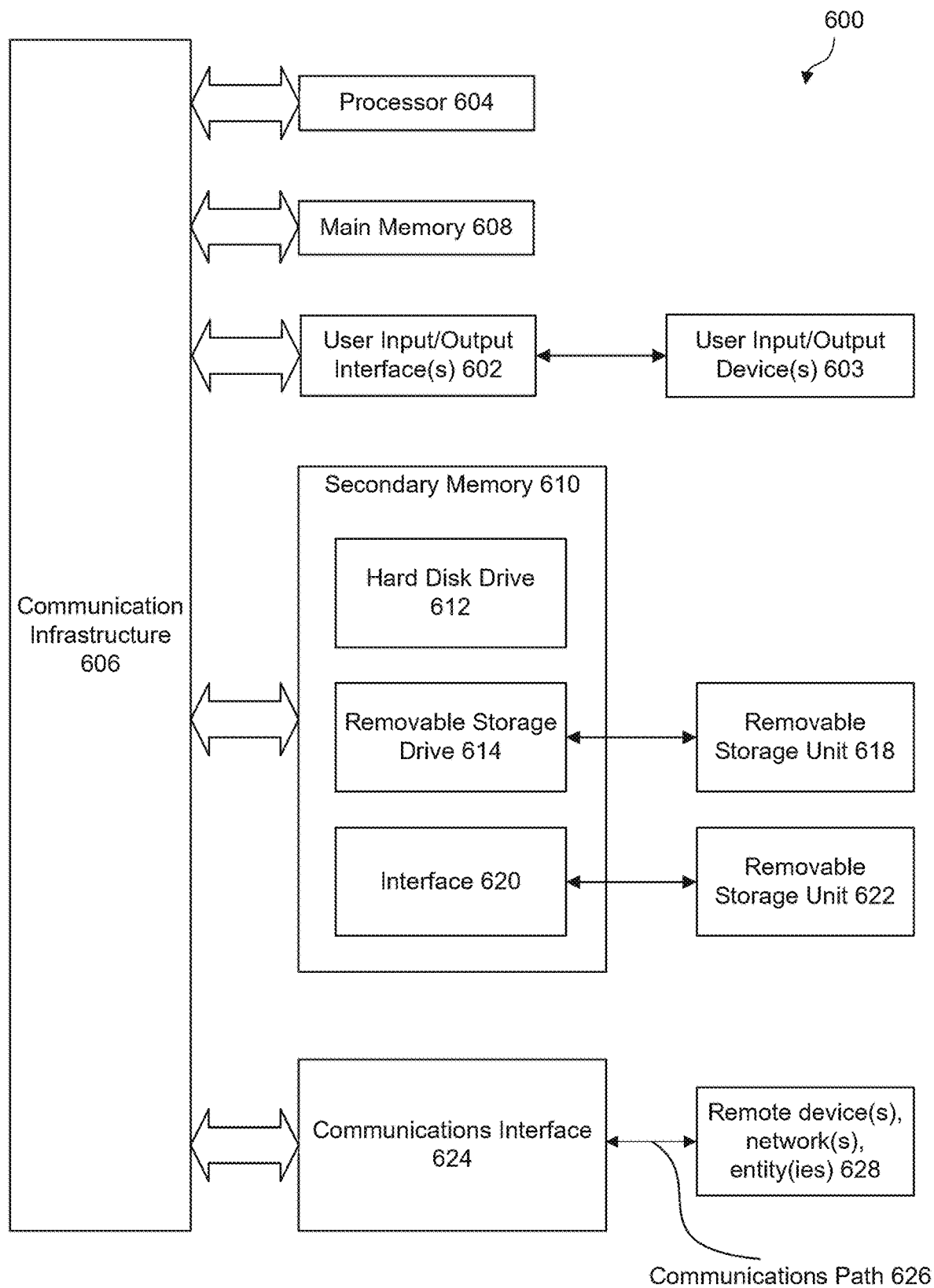
FIG. 6 illustrates a computer system for implementing various embodiments of the present disclosure, according to some embodiments.

FIG. 6 is an illustration of a computer system 600 in which various embodiments of the present disclosure can be implemented, according to some embodiments. Computer system 600 can be used in control unit/device 501, as described above. Computer system 600 can be any well-known computer capable of performing the functions and operations described herein. For example, and without limitation, computer system 600 can be capable of processing and transmitting signals. Computer system 600 can be used, for example, to control the movement of the wet bench structure.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. A control tool can receive instructions to implement functions and operations described herein—e.g., the method/process 400 described in FIG. 4—via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the functions described above with respect to the wet bench structure.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other means, instrumentalities or other approaches for allowing computer programs and/or other instructions and/or data to be accessed by computer system 600. Such means, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the functions described above with respect to the wet bench structure.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The functions/operations in the preceding embodiments can be implemented in a wide variety of configurations and architectures. Therefore, some or all of the operations in the preceding embodiments—e.g., the method/process 400 described in FIG. 4—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. For example, the hardware/equipment can be connected to or be part of element 628 (remote device(s), network(s), entity (ies) 628) of computer system 600.

By using the disclosed wet bench structures and methods, damage and contamination on wafers caused by unchanged flow field and processing deposits can be reduced and product yield can be increased. The wet bench structure can have any suitable form that disturbs the flow field of the processing agent in the tank. The disclosed wet bench structure can spin wafers and create disturbed flow field paths and take up little or no additional space in the tank, so that the capacity of the tank is not affected by the installment of the wet bench structure. The wet bench structure can be flexibly fixed or mounted in any suitable position of the tank, depending on, e.g., the dimensions and capacity of the tank, the position of the inlets, the sizes of the wafers, etc. For example, the wet bench structure can be fixed or mounted on lifting devices so the wet bench structure can support and spin the wafers. In another example, the wet bench structure can be fixed or mounted on the tank. The wet bench structure can also be fixed or mounted on both the lifting devices and the tank. The specific arrangement and operation of the wet bench structure should be determined based on the processing conditions and should not be limited by the embodiments of the present disclosure.

In some embodiments, an apparatus for processing one or more objects includes a carrier configured to hold the one or more objects, a tank filled with a processing agent and configured to receive the carrier, and a spinning portion configured to contact the one or more objects and to spin the one or more objects to disturb a flow field of the processing agent.

In some embodiments, a method for reducing contamination on one or more objects includes securing the one or more objects in a carrier, immersing the carrier in a processing agent, spinning the one or more objects in the carrier to form current paths different from flow-field paths of the processing agent, and rinsing the one or more objects.

In some embodiments, a system for reducing contamination on one or more objects includes a process tool. The process tool includes a carrier configured to hold the one or more objects, a tank filled with a processing agent and configured to receive the carrier, and a spinning device configured to spin the one or more objects based on a control signal. The system also includes a control device configured to determine the control signal for the spinning device. The control signal can include a spin speed for the spinning device. The system further includes a communication device configured to transmit the control signal from the control device to the spinning device.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. An apparatus, comprising:
a carrier configured to hold a plurality of objects, wherein the carrier comprises a handle and one or more lifting portions;
a tank configured to receive the carrier, wherein the tank holds a processing agent;
a first roller configured to rotate a first sub-roller in contact with a first object of the plurality of objects and configured to spin the first object at a first speed;
a second roller configured to rotate a second sub-roller in contact with a second object of the plurality of objects and configured to simultaneously spin the second object at a second speed different from the first speed, wherein:
the first roller is attached to a first sidewall of the tank and the second roller is attached to a second sidewall of the tank, and
the first sub-roller and the second sub-roller are detached from each other; and
a control device programmed to simultaneously rotate the first object at the first speed and the second object at the second speed.

2. The apparatus of claim 1, further comprising a third roller and a fourth roller attached to the one or more lifting portions, wherein the third roller and fourth roller are configured to contact an edge of the plurality of objects.

3. The apparatus of claim 1, wherein the first sub-roller and the second sub-roller are configured to spin in different directions.

4. The apparatus of claim 2, wherein the third roller comprises a third sub-roller and the fourth roller comprises a fourth sub-roller, wherein the third sub-roller and the fourth sub-roller are detached from each other.

5. The apparatus of claim 1, further comprising a fan or a propeller configured to disturb a flow field of the processing agent.

6. The apparatus of claim 1, wherein the one or more lifting portions comprise a plurality of grooves, wherein the plurality of objects are configured to be positioned in the plurality of grooves.

7. The apparatus of claim 1, further comprising an inlet configured to supply the processing agent to the tank in a first circular direction, and wherein the first sub-roller is configured to spin the first object of the plurality of objects in the first circular direction and the second sub-roller is configured to spin the second object of the plurality of objects in a second circular direction opposite to the first circular direction.

8. An apparatus, comprising:
a carrier configured to hold a plurality of objects, wherein the carrier comprises a handle and one or more lifting portions;
a tank configured to hold a processing agent and to receive the carrier, wherein a top portion of the handle is configured to be above a top level of the processing agent;
a first roller attached to a first sidewall of the tank and configured to spin the plurality of objects based on a control signal, wherein the first roller is configured to rotate a first sub-roller in contact with a first object of the plurality of objects
a second roller attached to a second sidewall of the tank and configured to spin a second object of the plurality of objects based on the control signal, wherein the second roller is configured to rotate a second sub-roller in contact with the second object of the plurality of objects; and
a computing device programmed to generate the control signal for simultaneously rotating the first roller and the second roller, wherein the control signal comprises a first spin speed and a first spin direction for the first object of the plurality of objects and a second spin speed and a second spin direction for the second object of the plurality of objects, and wherein the first spin speed is different from the second spin speed.

9. The apparatus of claim 8, wherein the first sub-roller and the second sub-roller are configured to contact a side edge of the plurality of objects.

10. The apparatus of claim 8 further comprising another roller attached to one of the one or more lifting portions.

11. The apparatus of claim 8, wherein the first sub-roller and the second sub-roller are attached to the first roller and the second roller respectively, and configured to extend along a direction that the plurality of objects are aligned.

12. The apparatus of claim 8, wherein the first sub roller is in contact with an edge of a first object of the plurality of objects and the second sub roller is in contact with an edge of a second object of the plurality of objects, and wherein the first sub-roller is laterally aligned to and disconnected from the second sub-roller.

13. The apparatus of claim 12, wherein the first sub-roller is configured to spin the first object at the first spin speed and in the first spin direction, and wherein the second sub-roller is configured to spin the second object at the second spin speed and in the second spin direction different from the first spin direction.

14. A system, comprising:
a carrier configured to hold a plurality of objects;
a wet bench tank comprising a processing agent, wherein the processing agent covers a surface of the plurality of objects;
a first roller attached to a first sidewall of the wet bench tank and configured to rotate a first sub-roller, wherein the first sub-roller is configured to rotate a first object of the plurality of objects at a first speed;
a second roller attached to a second sidewall of the wet bench tank and configured to rotate a second sub-roller, wherein the second sub-roller is configured to rotate a second object of the plurality of objects at a second speed; and
a control device programmed to simultaneously rotate the first object of the plurality of objects at the first speed and the second object of the plurality of objects at the second speed, wherein the first speed is different from the second speed.

15. The system of claim 14, wherein the first sub-roller is configured to spin the first object of the plurality of objects and the second sub-roller is configured to spin the second object of the plurality of objects in the carrier in opposite directions.

16. The system of claim 14, wherein the first sub-roller and the second sub-roller are configured to contact the plurality of objects along a direction that the plurality of objects are aligned.

17. The system of claim 16, wherein the first sub-roller is configured to not spin the first object of the plurality of objects and the second sub-roller is configured to spin the second object of the plurality of objects at a non-zero speed.

18. The system of claim 14, wherein the first sub-roller and the second sub-roller are configured to contact and to spin the plurality of objects in a plurality of directions.

19. The system of claim 14, wherein the first sub-roller and the second sub-roller are configured to spin the plurality of objects at a speed based on an afflux speed of the processing agent.

20. The system of claim 14, wherein the first sub-roller and the second sub-roller are configured to spin the plurality of objects at a speed based on a size of the plurality of objects, a position of the plurality of objects in the carrier, and a flow field of the processing agent.

* * * * *